United States Patent
Wallace (10) Patent No.: US 8,123,038 B1
(45) Date of Patent: Feb. 28, 2012

(54) FLOATER PACKAGING

(75) Inventor: William E. Wallace, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 892 days.

(21) Appl. No.: 11/539,602

(22) Filed: Oct. 6, 2006

(51) Int. Cl.
*B65D 81/02* (2006.01)
*B65D 85/30* (2006.01)

(52) U.S. Cl. ..... 206/583; 206/521; 206/523; 220/23.83; 220/23.89; 220/255; 220/256.1; 53/472

(58) Field of Classification Search ........... 206/583, 206/593, 592, 521, 523; 220/23.83, 23.87, 220/23.89, 255, 256.1; 53/472
See application file for complete search history.

(56) References Cited

U.S. PATENT DOCUMENTS

| | | | | |
|---|---|---|---|---|
| 1,912,686 A * | 6/1933 | Brack | | 206/592 |
| 2,552,641 A * | 5/1951 | Morrison | | 220/592.25 |
| 4,114,761 A * | 9/1978 | Kleiner | | 206/591 |
| 4,709,817 A * | 12/1987 | Keady et al. | | 206/523 |
| 4,953,705 A * | 9/1990 | Evamy | | 206/594 |
| 5,127,525 A * | 7/1992 | Hummer | | 206/586 |
| 5,385,232 A * | 1/1995 | Foos et al. | | 206/320 |
| 5,566,827 A * | 10/1996 | Janhonen | | 206/424 |
| 5,816,395 A * | 10/1998 | Dougherty | | 206/314 |
| 6,298,989 B1 * | 10/2001 | Chu | | 206/320 |
| 6,877,608 B2 * | 4/2005 | Koike | | 206/592 |
| 2001/0020595 A1* | 9/2001 | Koike | | 206/521 |
| 2005/0218030 A1* | 10/2005 | Mak | | 206/521 |

* cited by examiner

*Primary Examiner* — J. Gregory Pickett
*Assistant Examiner* — Blaine Neway
(74) *Attorney, Agent, or Firm* — Beyer Law Group LLP (57) ABSTRACT

A packaging system for holding an object is provided. An outer container comprising a top, a bottom, and a plurality of sides is provided. An inner container comprising a top, a bottom, and a plurality of sides is provided. A top floater is attached to the top of the outer container. The top of the inner container is attached to the top floater. A bottom floater is attached to the bottom of the outer container. The bottom of the inner container is attached to the bottom floater. An internal support is attached to the inner container.

20 Claims, 6 Drawing Sheets

FLOATER PACKAGING

BACKGROUND OF THE INVENTION

The present invention relates to the packaging of objects, especially fragile objects such as semiconductor devices and equipment parts used in clean rooms.

The need to adequately protect fragile or delicate objects during their transportation is prevalent. A strong and secure packaging system is especially desirable when the objects to be transported are expensive and require much work and effort to manufacture. The packaging system should be able to cope with various occurrences during transportation that may be hazardous to the objects inside the packages. For example, a package may be dropped accidentally, in which case the packaging system must be able to absorb the shock. Or, force and pressure may be exerted against a package, in which case the packaging system must be strong enough to withstand the force or pressure and ensure that the object inside is not damaged.

Common conventional methods of packaging fragile objects include wrapping the objects in plastic bubble sheets or bags prior to putting them in packaging boxes, lining the packaging boxes with foam, air bags, gel packs, etc. While these precautions may provide some protection to the objects packed inside the boxes, they also have different shortcomings. For example, foam bubbles or air bags used to line the packaging boxes may move randomly during transportation, especially if the boxes are turned around, so that they provide inconsistent protection to all sides of the objects inside. And worse, the objects inside may move with the foam bubbles or air bags and hit the sides of the boxes, and if external forces happen to be applied to the boxes at these positions, the impact may be transferred from the boxes to the objects.

Packing and unpacking these boxes are time consuming, because it takes multiple steps. Human error, perhaps due to inattention, may result in the objects being inadequately or incorrectly packed and subsequently damaged during transportation. The foam, air bags, gel packs, and bubble sheets can make the packing and unpacking of the boxes messy processes. Once a box is unpacked and the object taken out, it is inconvenient, even difficult at times, to repack the object back into the same box.

Therefore, it is desirable to create a packaging system that ensures the objects inside being consistently and adequately protected in all aspects, while the packing and unpacking of the boxes are simple, neat, one-step processes.

SUMMARY OF THE INVENTION

To achieve the foregoing and in accordance with the purpose of the present invention a method for forming packaging system for holding an object is provided. An outer container and an inner container are provided, and each container comprises a top, a bottom, and a plurality of sides. A top floater is attached to the top of the outer container, and the top of the inner container is attached to the top floater. A bottom floater is attached to the bottom of the outer container, and the bottom of the inner container is attached to the bottom floater. An internal support is attached to the inner container.

In another embodiment of the invention, a method for forming packaging system for holding an object is provided. An outer container and an inner container are provided, and each container comprises a top, a bottom, and a plurality of sides. A top floater is attached to the top of the outer container, and the top of the inner container is attached to the top floater. A bottom floater is attached to the bottom of the outer container, and the bottom of the inner container is attached to the bottom floater. An internal support is attached to the inner container. The plurality of sides of the inner container are not in contact with the plurality of sides of the outer container.

In another embodiment of the invention, an apparatus for holding an object is provided. An outer container comprises a top, a bottom, and a plurality of sides. An inner container comprises a top, a bottom, and a plurality of sides. A top floater attached to and in between of the top of the outer container and the top of the inner container provides protection of the object held inside the apparatus. A bottom floater attached to and in between of the bottom of the outer container and the bottom of the inner container provides protection of the object held inside the apparatus. An internal support attached to the inner container provides support to the inner container and protection of the object held inside the apparatus.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one of ordinary skilled in the art, that the present invention may be practiced without some or all of these specific details. In other instances, well known process steps and/or structures have not been described in detail in order to not unnecessarily obscure the present invention.

The invention provides a packaging system for holding one or more objects inside. More specifically, the invention utilizes a two-layer packing system comprising an outer container and an inner container. The top and the bottom of the inner container are attached to the top and the bottom of the outer container via a top floater and a bottom floater respectively, such that the inner container "floats" inside the outer container. An internal support is further attached to the inner container to prevent the outer container and the inner container from collapsing. One or more objects are held inside the inner container.

Figure 1:
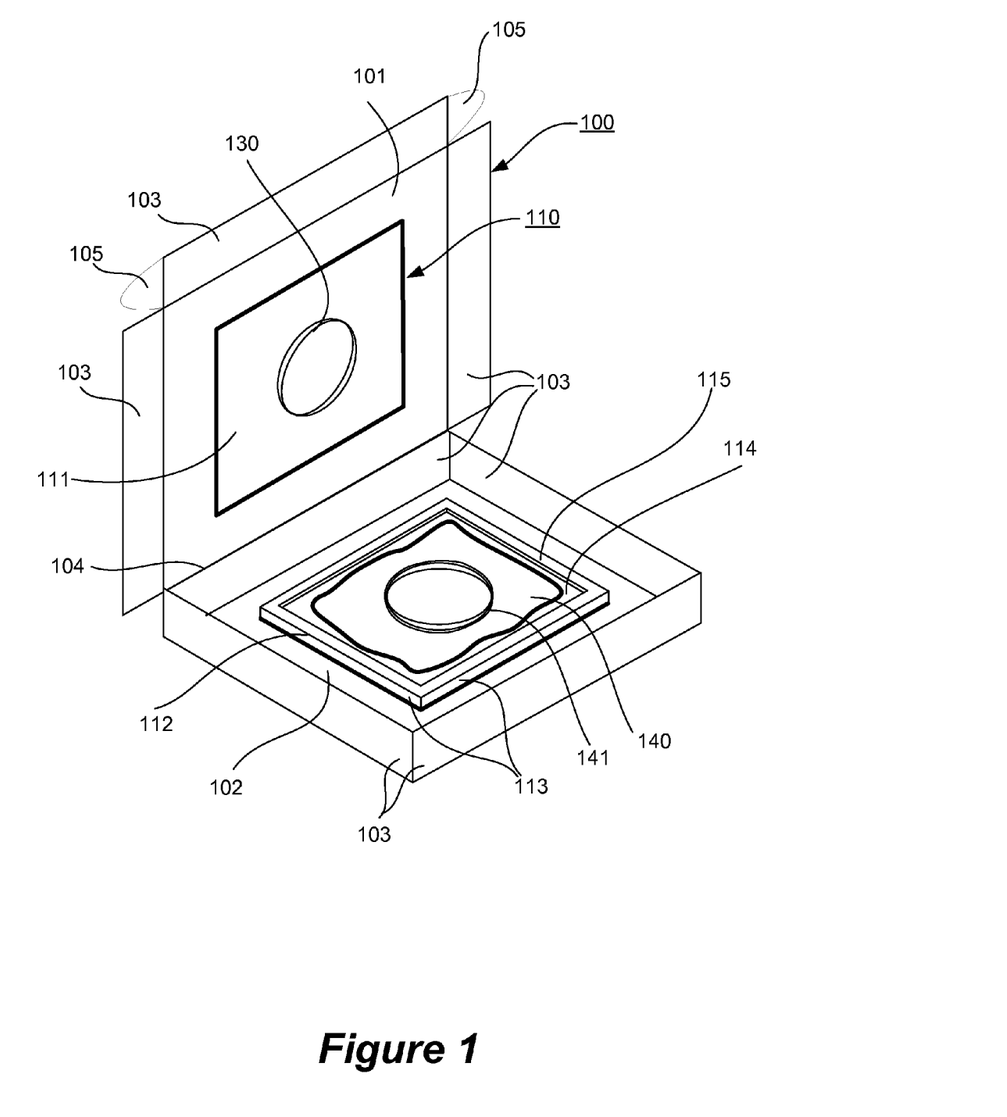
FIG. 1 is a packaging system according to an embodiment of the invention.

To facilitate understanding, FIG. 1 is a packaging system according to an embodiment of the invention. In this embodiment of the invention, the outer container 100 is a rectangular box with a top 101, a bottom 102, and four sides 103. The outer container 100 also has a locking mechanism 105, such that when the outer container 100 is closed, its top 101 is locked in place with its bottom 102. For example, the outer container may be a box with rolled-end-locking front. The top 101 and the bottom 102 of the outer container 100 may be connected via a hinge 104.

The inner container 110 is also a rectangular box with a top 111, a bottom 112, and four sides 113. The inner container 110 is smaller than the outer container 100 dimension-wise, and thus, the four sides 113 of the inner box 110 do not touch the four sides 103 of the outer box 100. In other words, there is a gap between the four sides 113 of inner box 110 and the four sides 103 of the outer box 100, and nothing is placed within this gap. More specifically, nothing is placed between the four sides 103 of the outer box 100 and the four sides 113 of the inner box 100, and the gap is merely empty space. This gap helps prevent the force exerted onto the outer box 100 from being transferred to the inner box 110.

The bottom 112 of the inner box 110 is shaped in such a way that its center 114 is lower than its edge 115. In other words, the raised edge 115 forms a frame-like structure around the center 114. When the inner box 110 is closed, its top 111 rests on the raised edge 115 of the box's bottom 112, but does not come in contact with the lowered center area 114 of the bottom 112. The object 140 is placed on the lowered center 114 of the bottom 112 of the inner box 110. The frame-like raised edge 115 surrounds the object 140 and prevents the object 140 from sliding out of the inner box 110 after the inner box 110 is closed.

An internal support 130 is attached to the top 111 of the inner box 110. The object 140 has an aperture 141 in the center, with a diameter that is greater than the diameter of the internal support 130. Thus, when the inner box 110 is closed, the internal support 130 passes through the object's aperture 141 and rests against the bottom 112 of the inner box 110. The internal support 130 prevents the outer box 100 and inner box 110 from collapsing when force is exerted from either the top or the bottom of the package. Since the internal support 130 rests against the bottom 112 of the inner box 110, if any force is exerted from either the top or the bottom of the package, the internal support 130 helps transfer the force to the inner box 110 so that the force does not exert on the object 140. The internal support 130 also helps prevent the object 140 from moving around the inner box 110 during transportation by holding the object 140 in place.

In FIG. 1, the top floater and bottom floater are hidden from view. The top floater is between the top of the outer box and the top of the inner box, and the bottom floater is between the bottom of the outer box and the bottom of the inner box. They will be shown in more detail in FIG. 2 below.

The size and shape of the outer container 100, the inner container 110, the top floater, the bottom floater, and the internal support 130 should be determined based on the size and the shape of the object 140 to be packed inside. For example, rectangular outer and inner boxes may be suitable for rectangular-shaped objects, while circular outer and inner boxes may be more appropriate for circular-shaped objects. Similarly, the number and placement of the top floater, bottom floater, and internal support 130 may also be determined based on the size and the shape of the object 140 to be packed inside. For example, an object 140 with a relatively large center aperture 141 may allow a single internal support 130 attached to the center of the inner box 110 to pass through, but for an object with no aperture, it may be necessary to place multiple and perhaps smaller internal supports around the object.

Figure 2:
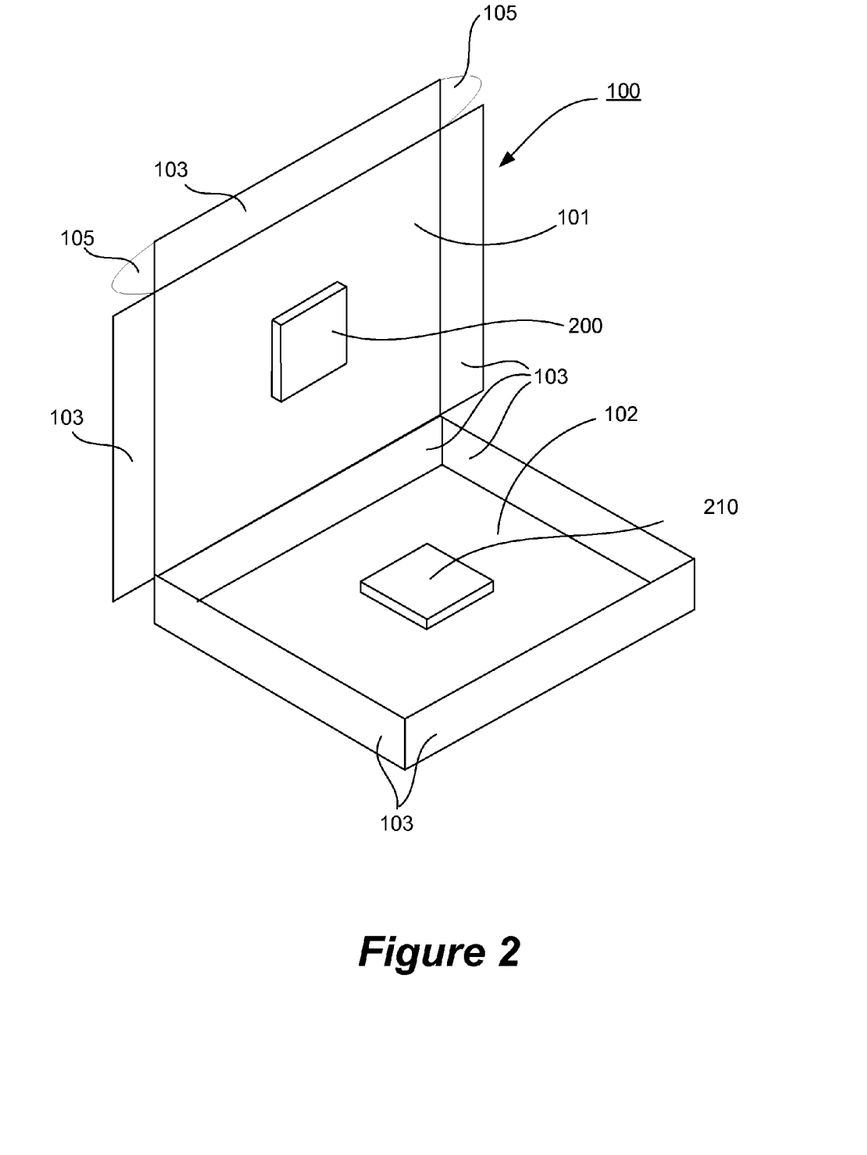
FIG. 2 is an outer container with a top floater and a bottom floater according to an embodiment of the invention.

FIG. 2 is an outer container with a top floater and a bottom floater according to an embodiment of the invention. In this embodiment of the invention, the outer container 100 is a rectangular box with a top 101, a bottom 102, and four sides 103. The top floater 200 is a square block attached to the top 101 of the outer box 100. More specifically, one side of the top floater 200 is attached to the inner side of the top 101 of the outer box 100. When the inner container is attached (not shown in FIG. 2), the outer side of the top of the inner box would be attached to the other side of the top floater 200. The bottom floater 210 is a square block attached to the bottom 102 of the outer box 100. More specifically, one side of the bottom floater 210 is attached to the inner side of the bottom 102 of the outer box 100. When the inner container is attached (not shown in FIG. 2), the outer side of the bottom of the inner box would be attached to the other side of the bottom floater 210.

The top floater 200 is positioned in-between the top 101 of the outer container 100 and the top of the inner container (not shown in FIG. 2). Thus, the top of the inner container does not come in direct contact with the top 101 of the outer container 100. The bottom floater 210 is positioned in-between the bottom 102 of the outer container 100 and the bottom of the inner container (not shown in FIG. 2). Thus, the bottom of the inner container does not come in direct contact with the bottom 102 of the outer container 100. Recall from FIG. 1 that the sides of the inner container are not in contact with the sides of the outer container. Therefore, the inner container is not in direct contact with the outer container from all sides—that is, the inner container "floats" inside the outer container, and the only connections between the inner container and the outer container are through the top floater 200 and the bottom floater 210. This structure provides additional protection to the object packed inside the inner container.

The size, shape, number, and placement of the top floater 200 and bottom floater 210 should be determined based on the actual application of the packaging system and the type of object to be packed inside. For example, the top and bottom floaters may be circular in shape, or there may be more than one top floaters and more than one bottom floaters used to connect the outer container and the inner container.

To illustrate, in the embodiment of the invention shown in FIGS. 1 and 2, because the package is designed to hold an object 140 with a large aperture 141 in the center, the design takes advantage of this aperture 141 when considering the shape, size, number, and placement of the top floater 200, the bottom floater 210, and the internal support 130. Specifically, there is only one top floater 200, bottom floater 210, and internal support 130, and each is positioned in the middle of the outer box 100 and inner box 110 where the aperture 141 would be when the object 140 is placed in the inner box 110. Further, the top floater 200, bottom floater 210, and internal support 130 are lined up. As noted above, when the boxes are closed, the internal support 130 passes through the object's 140 aperture 141 and rests against the bottom 112 of the inner box 110. Thus, if force is exerted either from the top or the bottom of the package, the top floater 200, bottom floater 210, and internal support 130 together protect the object 140 by bearing the external force and preventing the boxes from collapsing.

In another embodiment of the invention, if the package is designed to hold an object without any aperture, it may be more appropriate to use multiple top and bottom floaters and internal supports. For example, four top floaters, four bottom floaters, and four internal supports may be positioned near the four corners of the object respectively, and they will together protect the object as well.

There are many ways to attach a piece of material to another piece of material. For example, the top and bottom floaters may be glued to the top and bottom of the outer and inner containers. Alternatively, the floaters may be stapled, nailed, or taped to the containers. The same concept applies to attaching the internal support to the inner container.

Figure 3:
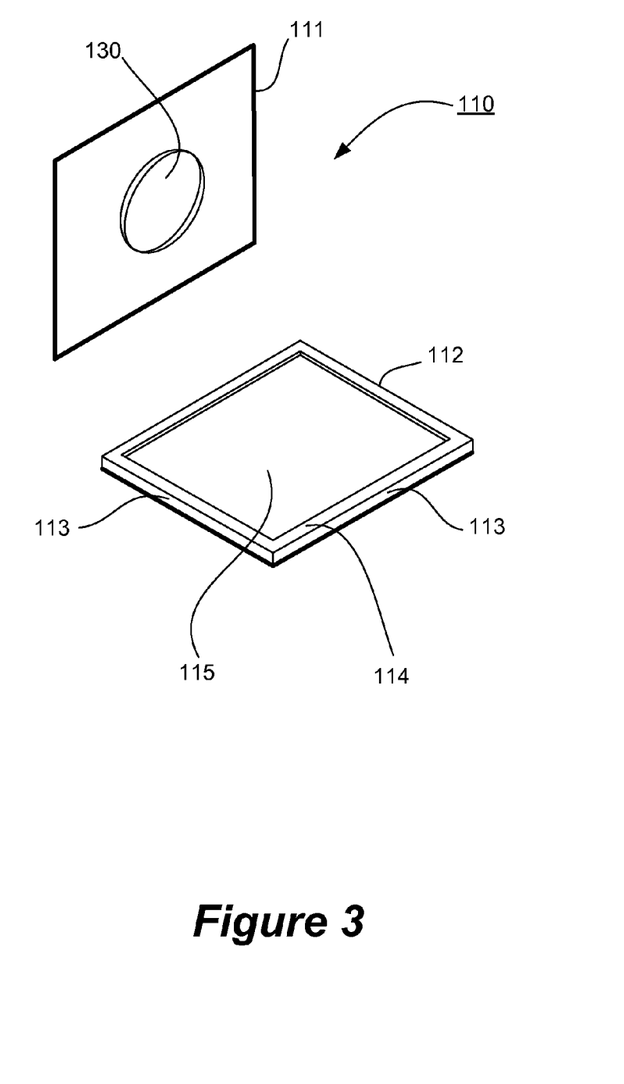
FIG. 3 is an inner container with an internal support according to an embodiment of the invention.

FIG. 3 is an inner container with an internal support according to an embodiment of the invention. In this embodiment of the invention, the inner container 110 is a rectangular box with a top 111, a bottom 112, and four sides 113. The bottom 112 of the inner box 110 is shaped in such a way that its center 114 is lower than its edge 115. An internal support 130 is attached to the top 111 of the inner container 110. More specifically, one side of the internal support 130 is attached to the inside of the top 111 of the inner container 110

The size, shape, number, and placement of the internal support 130 should be determined based on the actual application of the packaging system and the type of object to be packed inside. For example, the internal support 130 may be either attached to the top 111 or the bottom 112 of the inner container 110, or there may be multiple internal supports placed around the object to be placed inside the inner container 110.

Figure 4:
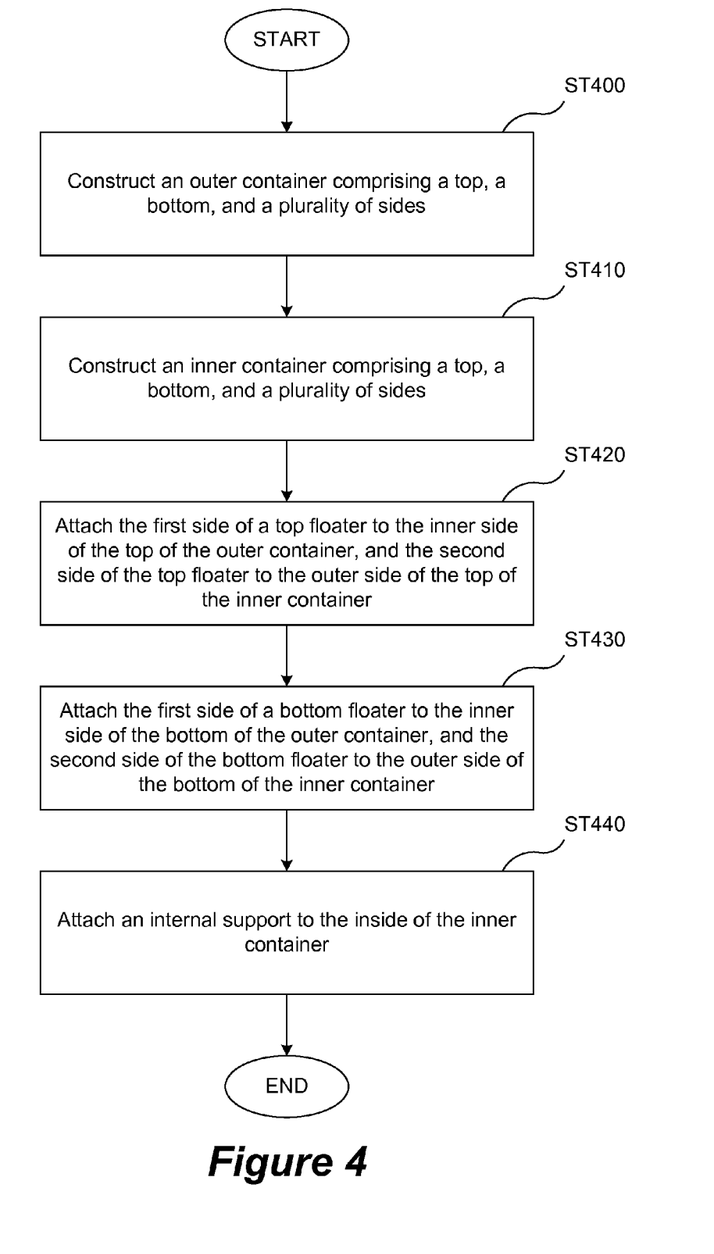
FIG. 4 is a high level flow chart of a process according to an embodiment of the invention.

FIG. 4 is a high level flow chart of a process according to an embodiment of the invention. In this embodiment of the invention, an outer container with a top, a bottom, and one or more sides is constructed ST400. A locking mechanism is optionally constructed on the outer container so that when the outer container is closed, its top and bottom are locked in place together. An Inner container with a top, a bottom, and one or more sides is constructed ST410.

Attach a top floater to the top of the outer container, and attach the top of the inner container to the top floater ST420. More specifically, attach one side of the top floater to the inside of the top of the outer container, and attach the other side of the top floater to the outside of the top of the inner container. Attach a bottom floater to the bottom of the outer container, and attach the bottom of the inner container to the bottom floater ST430. More specifically, attach one side of the bottom floater to the inside of the bottom of the outer container, and attach the other side of the bottom floater to the outside of the bottom of the inner container. Attach an internal support to the inside of the inner container ST440. Depending on the shape and size of the object to be held inside the inner container, the internal support may be attached either to the inside of the top or the inside of the bottom of the inner container.

When choosing the materials used to construct the outer container, the inner container, the top floater, the bottom floater, and the internal support, considerations should be given to the shape and the size of the object to be placed inside the packaging system. In addition, one should also consider the fragility of the object, the amount of force the package is required to withstand, as well as various special factors. For example, if the packaging system is used to protect a part of an instrument used in a clean-room environment, then preferably, all parts of the packaging system should also meet clean-room standard. More preferably, one may consider using materials such as polyethylene or polypropylene to construct the packaging system. On the other hand, if no clean-room standard is required, then preferably, materials such as polyurethane or cellulose may be used to save the cost of constructing the packaging system.

Figure 5A:
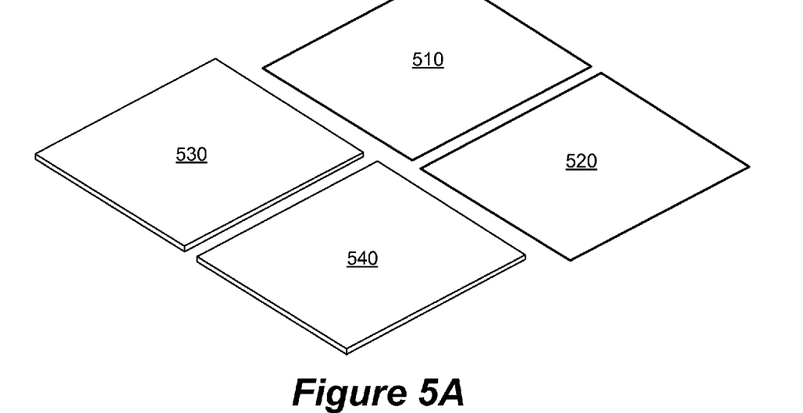
FIGS. 5A-C are a process according to an embodiment of the invention.
Figure 5B:
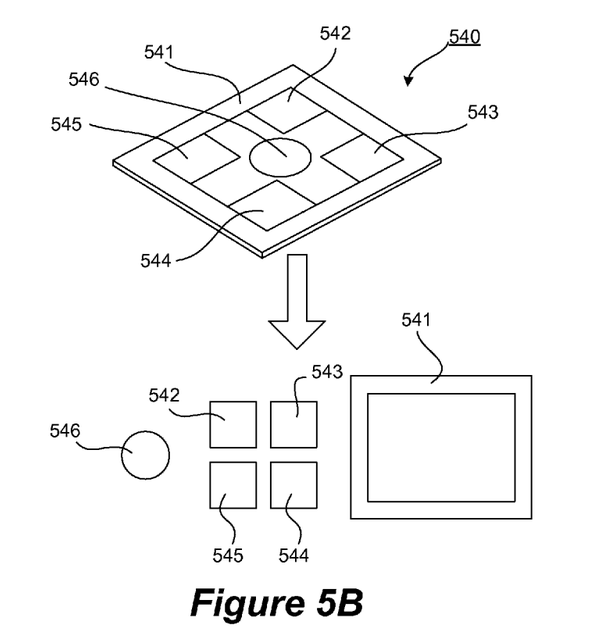
Figure 5C:
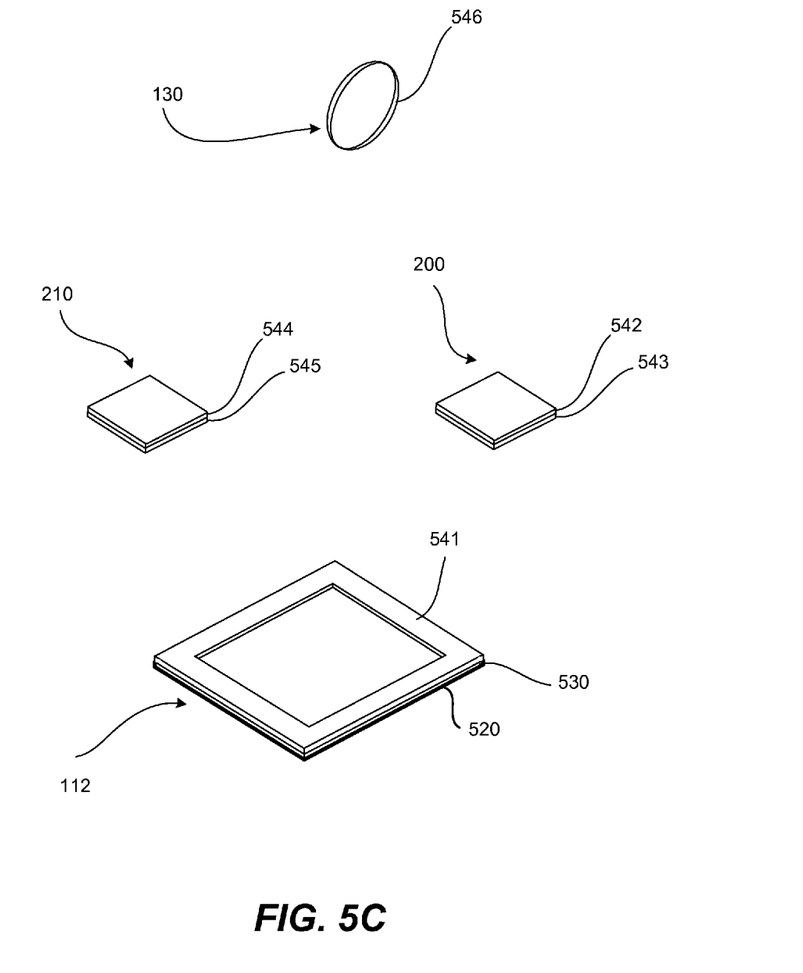

FIGS. 5A-C are a process according to an embodiment of the invention. More specifically, the process makes the inner container, the top floater, the bottom floater, and the internal support from four pieces of material and with one-step die process. In FIG. 5A, there are four pieces of material labeled Piece A 510, Piece B 520, Piece C 530, and Piece D 540. Preferably, the four pieces of material have the same width and length. The thickness may differ. More preferably, two pieces of material, Piece A 510 and Piece B 520, have the same thickness and are the same type of material, while the other two pieces of material, Piece C 530 and Piece D 540, have the same thickness and are the same type of material. Most preferably, in order to satisfy the clean-room standards while providing adequate protection to the fragile object packed inside the inner container, two pieces of material, Piece A 510 and Piece B 520, should be high-density polyethylene or polypropylene, while the other two pieces of material, Piece C 530 and Piece D 540, should be foamed polypropylene or polyethylene.

Out of these four pieces of material, Piece A 510 forms the top of the inner container, while Piece B 520, Piece C 530, and Piece D 540 are used to construct the bottom of the inner container, the top floater, the bottom floater, and the internal support.

In FIG. 5B, Piece D 540 is cut with a one-step die process. From Piece D 540, the die process cuts out an outer frame 541, four squares 542, 543, 544, 545, and a circular shape 546 in the middle, all in one step.

In FIG. 5C, the outer frame 541 is attached to one side of Piece C 530, while Piece B 520 is attached to the other, opposite side of Piece C 530. Together, the outer frame 541 and Piece C 530 forms the bottom of the inner container 112. Piece B 520 forms a bottom sheet between the bottom floater and the bottom of the inner container. The side where the frame 541 is attached to is the inner side of the bottom container, and the side where Piece B 520 is attached to is the outer side of the bottom container. Subsequently, the bottom of the inner container will be attached to the bottom floater.

In addition, attach two squares 542, 543 together to form the top floater 200, and attach the other two squares 544, 545 together to form the bottom floater 210. The circular shape 546 is assembled to form the internal support 130.

The method of cutting the original materials and assembling them into the inner container, the top floater 200, the bottom floater 210, and the internal support 130 should be determined based on the shape and size of the original materials, as well as the shapes and sizes of the inner container, the top floater, the bottom floater, and the internal support. For example, when necessary, multi-step die process may be required to make the cuts for the top and bottom floaters and the internal support out of a piece of material. Alternatively, the floaters and the internal support may be constructed from a different piece of material than the piece used to construct the inner box. Also alternatively, the floaters may be cut and assembled from one piece of material, while the internal support may be cut and assembled from another piece of material.

The present invention has many advantages over the existing packing systems. For example, the resulting structure provides a container within a container where a gap exists between the sides of the inner container and the sides of the outer container. In other words, there is empty space between the sides of the inner container and the sides of the outer container all the way around, and no additional padding material is required to fill this gap. The top of the inner container is attached to the top of the outer container only via the top floater. More specifically, the outer side of the top of the inner container is attached to one side of the top floater, while the inner side of the top of the outer container is attached to the other, opposite side of the top floater. Thus, the top of the inner container is not in direct contact with the top of the outer container, but the two are separated by the top floater. Similarly, the bottom of the inner container is attached to the bottom of the outer container only via the bottom floater. More specifically, the outer side of the bottom of the inner container is attached to one side of the bottom floater, while the inner side of the bottom of the outer container is attached to the other, opposite side of the bottom floater. Thus, the bottom of the inner container is not in direct contact with the bottom of the outer container, but the two are separated by the bottom floater. In fact, the inner container "floats" inside the outer container.

The double-layered containers provide more and better protection, especially due to the floating positioning of the inner container. Since the inner container is not in direct contact with the outer container, force exerted to the outer container is not transferred to the inner container. The internal support prevents the outer container and the inner container from collapsing onto the object packed inside. Together, the system provides greater shock, vibration, and compression deterrence.

It is easy to pack and unpack the containers. Since the inner container is attached to the outer container, opening and closing the outer container also opens and closes the inner container at the same time. It is not necessary to pack and unpack the two containers separately. Packing and unpacking are one-step processes, and the packing system can be reused again and again.

It is inexpensive and less wasteful to construct this packaging system. The parts used to assemble the packaging system are made using a one-step die process. Very little material is wasted during the construction of the packaging system. The design of the packaging system can be very flexible. The shape, size, and materials of the packaging system can be modified based on the objects to be packed inside, and the containers can be tailored to fit the object closely.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A packaging system for holding an object, comprising:
   an outer container comprising a top, a bottom, and a plurality of sides, wherein the bottom and plurality of sides form an opening, and wherein the top forms a single piece wherein when the top is in an open position, the top is removed from the opening and wherein the top is in a closed position the single piece spans the entire opening;
   a top floater, whereas the top floater is fastened to the top of the outer container;
   a bottom floater, whereas the bottom floater is attached to the bottom of the outer container;
   an inner container comprising a top, a bottom, and a plurality of sides, whereas the top of the inner container is fastened to the top floater and the bottom of the inner container is attached to the bottom floater, thereby suspending the top and bottom of the inner container, wherein placing the top of the outer container in an open position places the top of the inner container, which is fastened to the top of the outer container, in an open position and wherein placing the top of the outer container in a closed position places the top of the inner container, which is fastened to the top of the outer container, in a closed position; and
   an internal support, whereas the internal support is attached to the inner container.

2. The system, as recited in claim 1, further comprising:
   a bottom sheet comprising a first side, a second side and a plurality of edges, whereas
      the bottom sheet is between the bottom floater and the bottom of the inner container,
      the bottom sheet is attached to the bottom floater, and
      the bottom of the inner container is attached to the bottom sheet.

3. The system, as recited in claim 2, whereas the plurality of sides of the inner container and the plurality of edges of the bottom sheet are not in contact with the plurality of sides of the outer container.

4. The packaging system, as recited in 1, wherein when the outer container is closed the top floater, the internal support, and the bottom floater are in line along a common axis.

5. The packaging system, as recited in claim 1, wherein when the outer container is closed the top floater, the internal support, and the bottom floater are in line up in the middle of the outer container.

6. The packaging system, as recited in claim 1, wherein the top floater is attached to the middle of the top of the outer container.

7. The packaging system, as recited in claim 1, wherein the bottom floater is fastened to the bottom of the outer container, and wherein the bottom of the inner container is fastened to the bottom floater, and wherein all fastening is by gluing, stapling, nailing, or taping.

8. A packaging system for holding an object, comprising:
   an outer container comprising a top, a bottom, and a plurality of sides;
   a top floater, whereas the top floater is attached to the top of the outer container;
   a bottom floater, whereas the bottom floater is attached to the bottom of the outer container;
   an inner container comprising a top, a bottom, and a plurality of sides, whereas the top of the inner container is attached to the top floater and the bottom of the inner container is attached to the bottom floater, thereby suspending the top and bottom of the inner container; and
   an internal support, whereas the internal support is attached to the inner container, wherein the internal support is positioned so that when the outer container is closed, the internal support passes through an aperture of an object protected by the packaging system and extends from the top of the inner container to the bottom of the inner container and touches the top of the inner container and the bottom of the inner container.

9. The packaging system, as recited in 8, wherein when the outer container is closed the top floater, the internal support, and the bottom floater are in line along a common axis.

10. A method for forming a packaging system for holding an object, comprising:
    providing an outer container comprising a top, a bottom, and a plurality of sides;
    providing an inner container comprising a top, a bottom, and a plurality of sides;
    fastening a top floater to the top of the outer container;
    fastening the top of the inner container to the top floater, thereby suspending the to of the inner container;
    attaching a bottom floater to the bottom of the outer container;

attaching the bottom of the inner container to the bottom floater, thereby suspending the bottom of the inner container;

attaching an internal support to the inner container;

moving the outer container top to an open position, which moves the inner container top to an open position, since the inner container top is fastened to the outer container top; and moving the outer container top to a closed position, which moves the inner container top to a closed position, since the inner container top is fastened to the outer container top.

11. The method, as recited in claim 10, whereas the plurality of sides of the inner container are not in contact with the plurality of sides of the outer container.

12. The method, as recited in claim 10, whereas the top of the outer container comprises an outer side and an inner side, whereas the outer side of the top of the outer container is the opposite side of the inner side of the top of the outer container, the top of the inner container comprises an outer side and an inner side, whereas the outer side of the top of the inner container is the opposite side of the inner side of the top of the inner container, the top floater comprises a first side and a second side, whereas the first side of the top floater is the opposite side of the second side of the top floater, the first side of the top floater is fastened to the inner side of the top of the outer container, the outer side of the top of the inner container is fastened to the second side of the top floater, the bottom of the outer container comprises an outer side and an inner side, whereas the outer side of the bottom of the outer container is the opposite side of the inner side of the bottom of the outer container, the bottom of the inner container comprises an outer side and an inner side, whereas the outer side of the bottom of the inner container is the opposite side of the inner side of the bottom of the inner container, the bottom floater comprises a first side and a second side, whereas the first side of the bottom floater is the opposite side of the second side of the bottom floater, the first side of the bottom floater is attached to the inner side of the bottom of the outer container, and the outer side of the bottom of the inner container is attached to the second side of the bottom floater.

13. The method, as recited in claim 12, whereas the attaching of the outer side of the bottom of the inner container to the second side of the bottom floater further comprising:

attaching a bottom sheet between the bottom floater and the bottom of the inner container, whereas the bottom sheet is attached to the bottom floater and the bottom of the inner container is attached, to the bottom sheet.

14. The method, as recited in claim 13, whereas the bottom sheet comprises a first side, a second side, and a plurality of edges, whereas the first side of the bottom sheet is the opposite side of the second side of the bottom sheet, and the plurality of edges are not in contact with the plurality of sides of the outer container.

15. The method, as recited in claim 14, whereas the first side of the bottom sheet is attached to the second side of the bottom floater and the outer side of the bottom of the inner container is attached to the second side of the bottom sheet.

16. The method, as recited in claim 10, whereas the bottom of the inner container comprises an outer side and an inner side, whereas the outer side of the bottom of the inner container is the opposite side of the inner side of the bottom of the inner container, and the inner side of the bottom of the inner container comprises a raised frame surrounding a flat area for holding the object, whereas when the inner container is closed, the top of the inner container rests against the raised frame of the inner side of the bottom of the inner container and the top of the inner container is not in contact with the object placed on the flat area of the inner side of the bottom of the inner container, and wherein the bottom floater is attached to a part of the outer side of the bottom inner container opposite the flat area of the inner container.

17. The method, as recited in claim 10, whereas the object comprises an aperture, and the internal support is attached to the top of the inner container, whereas when the inner container is closed, the internal support passes through the aperture of the object and rests against the bottom of the inner container.

18. The method, as recited in claim 10, whereas the outer container comprises a locking mechanism that locks the top of the outer container to the bottom of the outer container.

19. The method, as recited in claim 10, whereas the outer container is a box comprising a rolled-end-locking front.

20. The method, as recited in claim 10, wherein the bottom floater is fastened to the bottom of the outer container, and wherein the bottom of the inner container is fastened to the bottom floater, and wherein all fastening is by gluing, stapling, nailing, or taping.

* * * * *